(12) United States Patent
Gallavan et al.

(10) Patent No.: US 6,466,003 B1
(45) Date of Patent: Oct. 15, 2002

(54) MICROAMP MEASUREMENT FOR TWO-TERMINAL DIGITAL METER

(75) Inventors: Michael F. Gallavan, Everett; William F. Rasnake, Bothell, both of WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 09/107,332

(22) Filed: Jun. 30, 1998

(51) Int. Cl.[7] .............................................. G01R 19/00
(52) U.S. Cl. ................................. 324/115; 324/99 D
(58) Field of Search .......................... 324/115, 103 R, 324/99 D, 121 R, 133; 702/67, 57; 340/660, 661, 662, 540

(56) References Cited

U.S. PATENT DOCUMENTS

| | | | |
|---|---|---|---|
| 5,119,019 A | | 6/1992 | George ........................ 324/115 |
| 5,142,221 A | * | 8/1992 | Meldrum et al. ............ 324/115 |
| 5,218,290 A | * | 6/1993 | Beckert et al. ............. 324/99 D |
| 5,250,893 A | * | 10/1993 | Gambill et al. ............. 324/99 D |
| 5,489,841 A | * | 2/1996 | Henkelmann ............ 324/103 R |
| 5,923,161 A | * | 7/1999 | Frankovitch, Jr. et al. .. 324/121 R |

* cited by examiner

Primary Examiner—Vinh P. Nguyen
(74) Attorney, Agent, or Firm—Dellett & Walters

(57) ABSTRACT

A two-terminal multimeter capable of both volt/ohm and current measurement employs an input protection circuit with a positive temperature coefficient impedance and a reference impedance, across which an A-D converter takes measurements. A current measurement signal activates a switch to ground one side of the reference impedance for taking current measurements. A controllable clamping switch grounds the positive temperature coefficient impedance in an input overload situation to provide input protection against damage to the meter components.

17 Claims, 3 Drawing Sheets

MICROAMP MEASUREMENT FOR TWO-TERMINAL DIGITAL METER

BACKGROUND OF THE INVENTION

This invention relates to digital multimeters capable of performing multiple functions such as voltage, resistance and current measurement, and more particularly to a two-terminal digital meter that provides microamp measurement capabilities.

Multimeters in general and digital multimeters (DMMs) in particular, employ a common and a volt/ohms input terminal. Meters that provide microamp current measurement employ a third input terminal that is separate from the volt/ohms input terminal. Therefore, is to measure microamps, a meter user must pull the test probe out of the volt/ohms terminal and insert it into the microamps terminal, before taking the measurement.

Especially with measuring microamps, it is desirable to provide protection circuitry, to avoid damaging a meter in case the user accidentally touches the probe tips to the wrong place and overloads the meter. Such protection typically comprises a fuse that is chosen to blow before the rest of the meter circuitry can be damaged. However, having to change fuses is annoying, especially when it results from an accidental slip of a test probe into an unintended test point.

Referring to FIG. 1, which is a diagram of input circuitry of a typical prior art digital multimeter, the meter 10 comprises a common input terminal 12, a volts/ohms input terminal 14, and a microamp input terminal 16. A shunt resistor 20 is placed between the common and microamp input terminals, with a fuse (F1) 18 in line with the microamp input terminal. The fuse is chosen to blow if the current exceeds a predetermined amount. Further provided across the microamp and common terminals is diode bridge circuitry 22, which provides further input protection. A protection resistor (100 k ohm in the illustration) is used to limit current into a single chip analog to digital (A-D) converter 26 when there is an overload. The measurement system 26, which, as noted, suitably comprises a single chip. analog to digital (A-D) converter, receives the output of resistor 24 and passes it through a switch 28, whereupon an A-D converter circuit is provided the input signal for measurement. Switch 28 suitably comprises a field effect transistor (FET) switch.

Other details of the prior art system include a switch 30 and resistor 32 in series in the common input line, the output thereof being provided to FET switch 34, which then is supplied to the A-D converter. The volts/ohms input terminal has a series resistor 36. which supplies the input signal to FET switch 38, the output thereof being connected to the junction of resistor 32 and FET switch 34. The various switches are actuated in accordance with the measurement to be taken. However, the multimeter user must physically move the input probe from the volts/ohms input terminal to the microamp input terminal in order to perform a microamp measurement. Once the current measurements are completed, then the probe must be moved back to the volts/ohms terminal if non-current type measurements are to be taken. Another drawback to the prior art system is that if the wrong input terminals are selected for a particular measurement, the multimeter can be damaged.

SUMMARY OF THE INVENTION

In accordance with the invention, a two-terminal multimeter is provided that enables voltage/ohm/microamp measurements without need of a third terminal. A first input and a common input are provided. A reference resistor is provided at either side thereof with a switch to ground, and these switches are activated to either ground the first or second end of the resistor. The first and second ends are also suitably connected to plus and minus sides of an A-D converter for obtaining appropriate measurement it values.

Accordingly, it is an object of the present invention to provide an improved digital multimeter that enables microamp measurements without need of a third input terminal.

It is a further object of the present invention to provide an improved multimeter that employs existing input protection and measurement components within a meter to enable microamp or volt/ohm measurements via only two terminals.

It is yet another object of the present invention to provide an improved system for volt/ohm/microamp measurement in a two terminal input meter.

A further object of the present invention is to provide an improved meter that is capable of measuring DC or AC microamps in addition to volts/ohms or other typical multimeter measurement functions with a two terminal input.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of. the present invention comprises a two terminal multimeter that measures volts/ohms as well as microamps via two input terminals. A third input terminal normally required for microamp measurements in accordance with the prior art is dispensed with.

Figure 1:
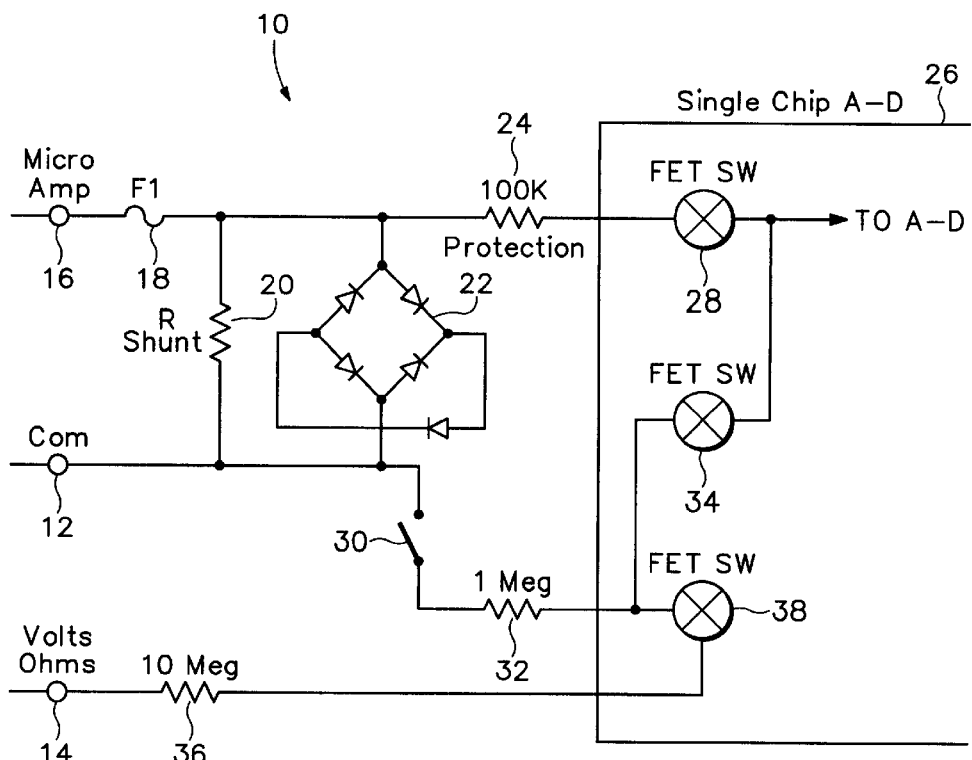
FIG. 1 is a diagram of input circuitry of a typical prior art digital multimeter.
Figure 2:
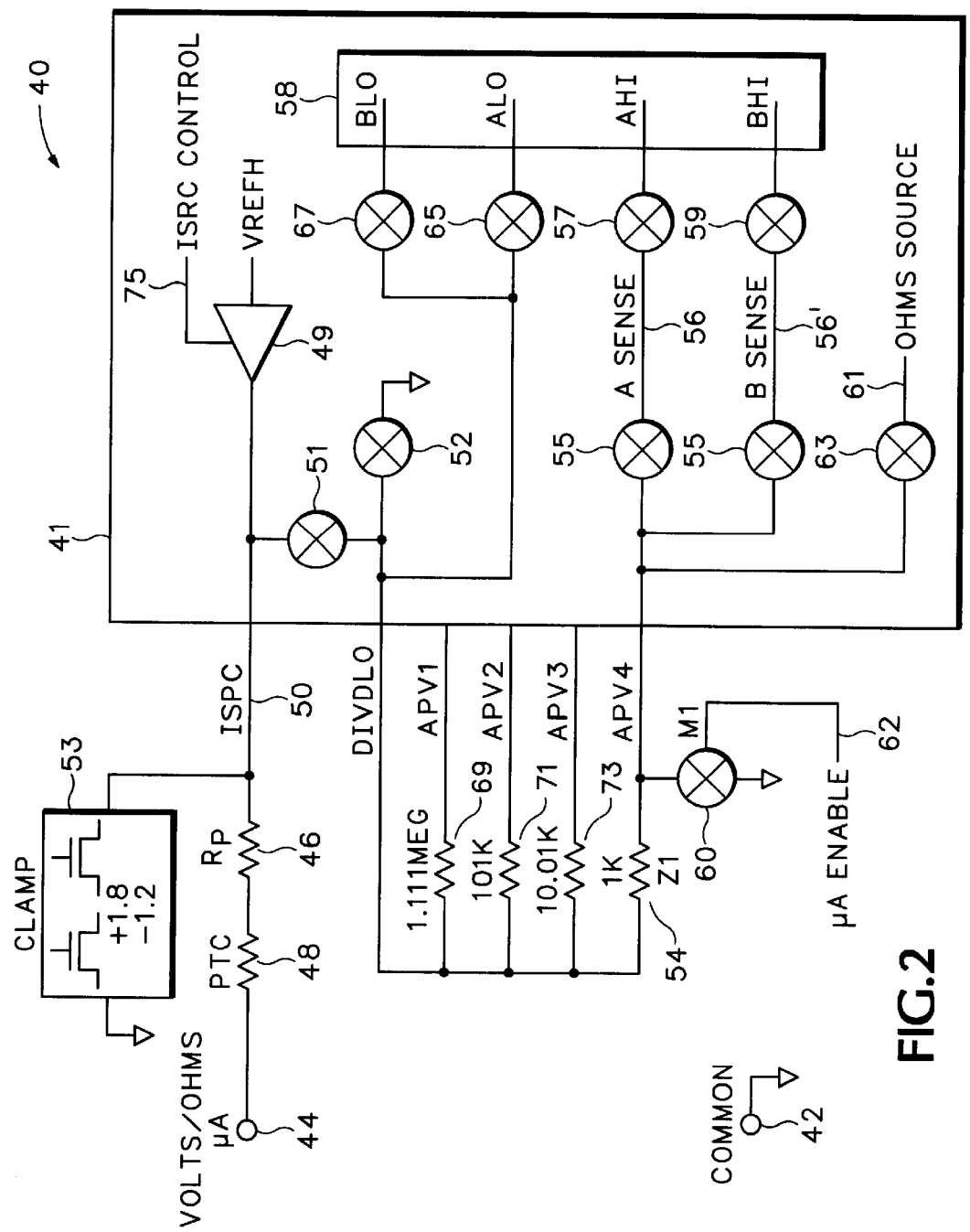
FIG. 2 is a diagram of input circuitry of a multimeter in accordance with the present invention.

Referring to FIG. 2, a diagram of input circuitry of a multimeter in accordance with the present invention, the front end input circuit 40 comprises a common input terminal 42, connected to ground, and a volts/ohms/microamp input terminal 44. A positive temperature coefficient resistor (PTC) 48 and a protection resistor ($R_p$)46 are connected in series between input terminal 44 and a junction point 50, connected to ground via clamp switch 53. The meter's control processor 41 includes a good portion of the. operational components of the meter. An op-amp 49 receives a voltage reference signal VREFH as an input, the output of the op-amp also being connected to junction point 50. In input ISRC Control 75 to the op-amp governs whether the op-amp is set to a high-impedance. A switch 51 connects point 50 to a switch 52, the other side of which is connected to ground. The common junction of switch 51 and 52 is also connected to input impedance Z1 54 (suitably comprising a reference resistor $R_{ref}$), and the opposite end of reference resistor Z1 54 provides sense inputs 56 and 56' to the plus inputs AHI and BHI of A-D converter 58. Switches are suitably provided to connect or disconnect the sense inputs from the A-D converter (switch 55 governing connection of the reference resistor 54 to sense lines 56 and 56', and additional switches 57 and 59 governing connection to AHI and BHI respectively). Further, an ohms source 61 is provided through a switch 63 to the reference resistor. The end of: resistor 54 that provides input to the sense line also connects through a FET switch 60 to ground, while the control of the FET switch 60 is directed by a microamp enable signal ($\mu$A enable) 62. The junction point of switches 51 and 52 also is provided as input to the minus side of A-D converter 58 as ALO and BLO, through switches 65 and 67 respectively. Additional reference resistors 69, 71 and 73 provide inputs to the control processor, to enable different range inputs, for example. In the illustrated embodiment, these additional resistors are not employed for microamp measurement functions. In a preferred embodiment, clamp 53 suitably comprises a pair of switching transistors.

Switches 51, 52, 55 and 63 are suitably Kelvin switches. Switches 59, 57, 65, 67 are switches in a matrix of switches within the instrument. The state of the switches depends upon the measurement mode. For example, in Ohms measurement mode, Kelvin switches 51, 55 and 63 are on, and matrix switches 67 and 59 are also on. Kelvin switch 52 is off, matrix switches 65 and 57 are off, and switch 60 is off. For voltage measurement mode, Kelvin switches 52 and 55 are on, matrix switches 65 and 57 are also on. Kelvin switches 51 and 63 are off, as are matrix switches 67 and 59. Switch 60 is also off.

For microamp measurement mode, Kelvin switches 51 and 55 are on, as are matrix switches 57 and 65. Switch 60 is on, while Kelvin switches 52 and 63 and matrix switches 59 and 67 are off. The ISRC control signal 75 sets op-amp 49 to a high impedance state, so it does not affect the current measurement. The AHI and ALO inputs to the A-D converter sense the voltage directly across reference resistor 54. Because of this, the on resistance of switches 51 and 60 are eliminated from the measurement.

In normal operation (V check mode) for voltage measurement, clamp 53 conducts if input voltage peak levels are exceeded, to protect other meter circuitry from an overvoltage input. In addition, $R_p$ 46 and PTC 48 present a low impedance to the input signal.

In accordance with certain style multimeters manufactured by the assignee of the present invention, $R_p$ 46, PTC 48, $R_{ref}$ 54 and clamp switch 53 are already provided as input protection and measurement components. In an overvoltage situation, the clamp automatically connects the right end of the PTC/$R_p$ resistor to ground. The impedance of the PTC resistor rises in this condition, providing a high impedance between the input terminal and ground, effectively protecting the rest of the meter from damage. Resistor $R_p$ is present to limit the surge current to avoid damage to the PTC resistor.

In voltage measurement mode, for example, the voltage drop across $R_{ref}$ is measured by the A-D converter. In accordance with the invention, these existing components are employed, and FET switch 60 is further utilized to enable dual use of $R_{ref}$ 54. For micro amp measurement, ($\mu$A enable) 62 is activated (by the multimeter's control processor, for example) which sets the right end of $R_{ref}$ 54 at ground. The left end of $R_{ref}$ 54 is supplied to the minus input of A-D converter 58 (the plus input being set to ground by operation of FET switch 60). Current measurement is thereby accomplished. The actuation of FET 60 is accomplished by the multimeter's control circuitry as is understood by those of skill in the art. The positive threshold for the clamp may be set by the controlling processor. The CLAMP 53 signal levels are +2.6 volts and +1.2 volts. The positive clamp threshold is approximately 0.5 volts above these values. The negative clamp voltage is fixed at –1.2 volts. When in microamp mode, the circuitry is automatically protected by Rp 46, PTC 48, and clamp 53. When a full scale current (400 uA, for example) is applied, the voltage at node 50 is below the clamp threshold.

With the embodiment illustrated, it will be noted that in microamp mode, the polarity of the connections to the A-D converter is reversed from the volt/ohm mode connections. This is accommodated by inverting the polarity of the measured value in further processing by the multimeter. The system according to the invention is also suitable for measurement of AC microamps, in addition to DC microamps. Such AC measurement is accomplished by re-routing of the measurement signals within the microprocessor by operation of the internal switching matrix thereof, to pass the signals through an AC signal source path.

Figure 3:
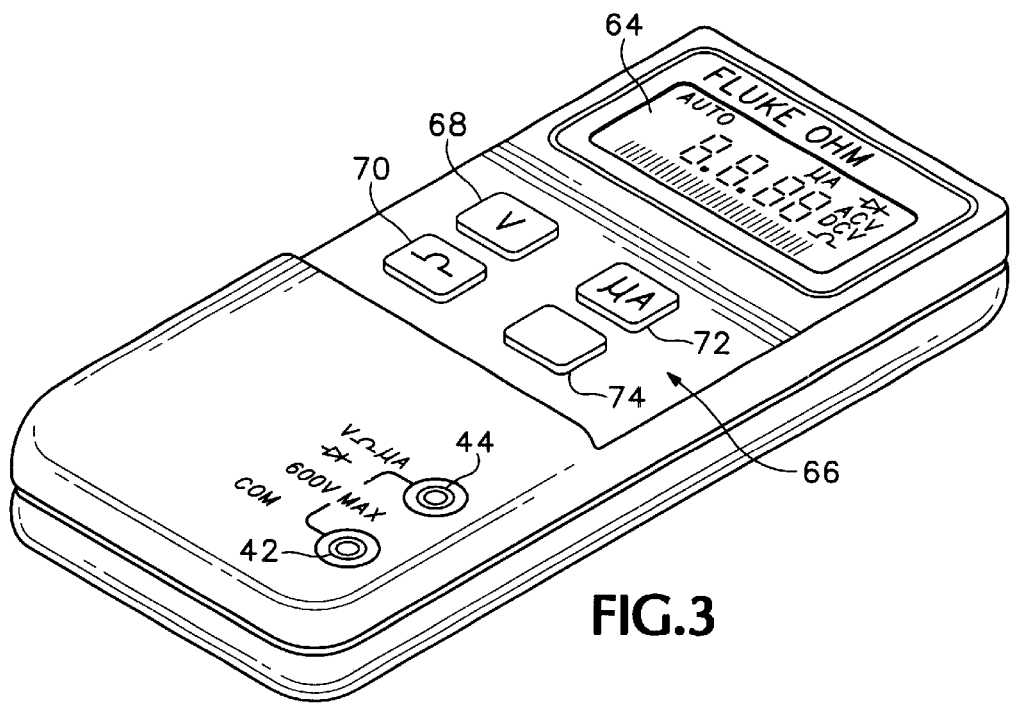
FIG. 3 is a perspective view of an exemplary multimeter incorporating the invention.

Referring to FIG. 3, a perspective view of an exemplary multimeter incorporating the invention, common input. 42 and volt/ohm/current input terminal 44 are provided. A display 64 shows the measured value as well as the particular units of measurement. A selector region 66 includes plural switches 68 (Volts), 70 (ohms), 72 (microamps) and 74 (other function, e.g. continuity), which enable selection of the desired measurement mode. Multiple functions may also selected by a single switch.

Accordingly, the present invention adds the capability of selectable voltage/ohm and current measurement with only a two input multimeter. The existing overvoltage protection components are advantageously employed to work either as volt/ohm measurement systems or as current measurement components.

While a preferred embodiment of the present invention has been shown and described, it will be apparent to those skilled in the art that many changes and modifications may be made without departing from the invention in its broader aspects. For example, while the preferred embodiment is shown for microamp measurement, larger ranges can be provided with selection of appropriate current rating for the multimeter's components. The appended claims are therefore intended to cover all such changes and modifications as fall within the true spirit and scope of the invention.

What is claimed is:

1. A method of providing a two terminal multimeter capable of measuring current in addition to volts or ohms, comprising the steps of:

providing a first input terminal for a common input;

providing a second input terminal for current/volt or ohms input selectively connectible to an A-D converter;

connecting a first end of a reference impedance to a first input of the A-D converter and connecting a second end of the reference impedance to a second input of the A-D converter;

selectively connecting or not connecting said second input terminal to one of said first and second ends of the reference impedance; and selectively grounding or not grounding an end of said reference impedance when measuring current or not measuring current.

2. The method according to claim 1 wherein the current measurement is a DC current measurement.

3. The method according to claim 1 wherein the current measurement is an AC current measurement.

4. A multimeter capable of volt/ohm/current measurement with two input terminals, comprising:
   a first common input terminal;
   a second volt/ohm/current input terminal;
   an input impedance including a positive temperature coefficient;
   a reference impedance;
   an A-D converter, wherein said positive temperature coefficient input impedance and said reference impedance are in series between said second input terminal and a first input of said A-D converter and wherein a second input of said A-D converter is connected to the junction of said input impedance and said reference impedance; and
   switch means for selectively connecting or disconnecting the junction between the reference impedance and said first input terminal of said A-D converter to said common input terminal.

5. A multimeter according to claim 4 further comprising:
   clamping means for selectively connecting the junction of said positive temperature coefficient input impedance and said reference impedance to the common input terminal in an overload situation.

6. A multimeter according to claim 5 wherein said clamping means comprises a pair of switching transistors.

7. A multimeter according to claim 4 wherein the current measurement is a DC current measurement.

8. A multimeter according to claim 4 wherein the current measurement is an AC current measurement.

9. A method of providing employing an existing set of input protection and measurement components in a multimeter to provide current measurement in addition to voltage or ohms measurement comprising the steps of:
   employing a first input terminal for volt, ohm and current measurement signal input;
   employing a second input terminal for a common input;
   providing a solid state switch that is selectively actuable to ground or not ground one end of a measurement reference impedance that is part of a measurement circuit; and
   measuring volts/ohms when said solid state switch is not grounding the measurement reference impedance; and
   measuring current when said solid state switch is grounding the measurement reference impedance,
   said volts/ohms and current measurements being accomplished via employing said first and second input terminals, in absence of employing an additional input terminal, to effect both volts/ohms and current measurements.

10. The method according to claim 9 wherein the current measurement is a DC current measurement.

11. The method according to claim 9 wherein the current measurement is an AC current measurement.

12. A multimeter adapted to measure volts/ohms and current comprising:
   a first volts, ohms or current input terminal;
   a second common input terminal;
   input overload protection associated with at least one of the two input terminals for protecting the meter against application of excess voltage/current to at least one of the first or second input terminals; and
   a selector for switching between volts/ohms measurement mode and current measurement mode, whereby the input overload protection is effective in both volts/ohms measurement mode and in current measurement mode, and
   whereby volts, ohms and current measurements are effected via the first and second input terminals in absence of employing an additional-input terminal.

13. A multimeter according to claim 12, wherein said selector comprises a switch that is actuable to connect a reference measurement impedance alternatively in a volts/ohms measurement configuration or a current measurement configuration.

14. A multimeter according to claim 12 wherein the current measurement is a DC current measurement.

15. A multimeter according to claim 12 wherein the current measurement is an AC current measurement.

16. A two input terminal multimeter adapted to measure volts/ohms and current via the two input terminals, comprising:
   input overload protection for protecting the meter against application of excess voltage/current to at least one of the two input terminals; and
   a selector for switching between volts/ohms measurement mode and current measurement mode, whereby the input overload protection is effective in both volts/ohms measurement mode and in current measurement mode,
   wherein said input overload protection comprises:
      a positive temperature coefficient input impedance associated with at least one of the two input terminals; and
      a clamp associated with at least one of the two input terminals to connect the input impedance to a common junction for presenting a high input impedance in an overload situation.

17. A two input terminal multimeter according to claim 16, further comprising:
   a reference impedance; and
   an analog to digital converter having first and second inputs connected to first and second ends of said reference impedance, wherein said reference impedance is in series between said positive temperature coefficient input impedance and said analog to digital converter,
   wherein said selector for switching between volts/ohms measurement mode and current measurement mode comprises a switch for selectively connecting the end of said reference impedance that is not connected to the positive temperature coefficient to the common junction in current measurement mode.

* * * * *